United States Patent
Han et al.

(10) Patent No.: US 9,001,704 B2
(45) Date of Patent: Apr. 7, 2015

(54) AUTOMATIC GAIN CONTROL APPARATUS AND METHOD IN A WIRELESS COMMUNICATION SYSTEM

(75) Inventors: Seung-Hee Han, Hwaseong-si (KR); Sung-Yoon Jung, Seoul (KR); Sang-Boh Yun, Seongnam-si (KR); Joo-Hyun Lee, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 559 days.

(21) Appl. No.: 12/454,828

(22) Filed: May 22, 2009

(65) Prior Publication Data
US 2009/0290516 A1  Nov. 26, 2009

(30) Foreign Application Priority Data
May 23, 2008  (KR) ......................... 10-2008-0048238

(51) Int. Cl.
*H04B 7/00* (2006.01)
*H03G 3/30* (2006.01)
*H04B 1/10* (2006.01)

(52) U.S. Cl.
CPC ........... *H03G 3/3068* (2013.01); *H04B 1/1027* (2013.01)

(58) Field of Classification Search
USPC ......... 370/286, 289, 332, 333, 277, 335, 254, 370/268–269; 455/136, 138, 219, 239.1, 455/245.1, 250.1, 247.1, 134, 232.1, 522; 375/267, 344
See application file for complete search history.

(56) References Cited

U.S. PATENT DOCUMENTS

| 5,333,175 | A * | 7/1994 | Ariyavisitakul et al. ...... 455/423 |
| 6,794,858 | B2 * | 9/2004 | Ishii ........................... 324/76.78 |
| 7,519,029 | B2 * | 4/2009 | Takeda et al. ................. 370/335 |
| 7,697,626 | B2 * | 4/2010 | Wang et al. .................... 375/267 |
| 7,869,761 | B2 | 1/2011 | Park et al. |
| 2002/0183028 | A1 * | 12/2002 | Takahashi et al. .......... 455/232.1 |
| 2003/0125067 | A1 * | 7/2003 | Takeda et al. ................. 455/522 |
| 2006/0050655 | A1 * | 3/2006 | Shi et al. ........................ 370/254 |
| 2007/0165736 | A1 | 7/2007 | Wang et al. |
| 2007/0293177 | A1 * | 12/2007 | Li ................................ 455/232.1 |
| 2007/0298749 | A1 * | 12/2007 | Saito et al. .................... 455/303 |
| 2008/0273635 | A1 * | 11/2008 | Neuhaus et al. ............... 375/344 |

FOREIGN PATENT DOCUMENTS

KR  10-0658211  12/2006

OTHER PUBLICATIONS

Korean Notification of Reasons for Rejection dated Jun. 18, 2014 in connection with Korean Application No. 10-2008-0048238, 7 pages.

* cited by examiner

Primary Examiner — Vincelas Louis

(57) ABSTRACT

An apparatus and method for adaptively adjusting a target Received Signal Strength Indicator (RSSI) for Automatic Gain Control (AGC) in a full-duplex relay apparatus with an interference cancellation function. A Signal to Interference Ratio (SIR) estimation block estimates an SIR based on an interference signal estimated from a received signal and an interference-cancelled signal determined by cancelling the estimated interference signal from the received signal. A target RSSI determination block determines a target RSSI according to the estimated SIR. An AGC block adjusts a gain for the received signal based on the determined target RSSI.

20 Claims, 11 Drawing Sheets

AUTOMATIC GAIN CONTROL APPARATUS AND METHOD IN A WIRELESS COMMUNICATION SYSTEM

CROSS-REFERENCE TO RELATED APPLICATION(S) AND CLAIM OF PRIORITY

The present application claims the benefit under 35 U.S.C. §119(a) of a Korean Patent Application filed in the Korean Intellectual Property Office on May 23, 2008 and assigned Serial No. 10-2008-0048238, the entire disclosure of which is hereby incorporated by reference.

TECHNICAL FIELD OF THE INVENTION

The present invention relates to an Automatic Gain Control (AGC) apparatus and method in a wireless communication system. More particularly, the present invention relates to an apparatus and method for automatically controlling a gain taking interference signals into consideration.

BACKGROUND OF THE INVENTION

Commonly, electrical devices that process signals have an AGC circuit to reduce and prevent inter-modulation and saturation occurring in an amplification stage. In particular, an AGC circuit in a reception apparatus for a wireless communication system is used to obtain a signal having a desired level after receiving a signal having an inconstant level. The AGC circuit prevents signal saturation by decreasing a gain value when strength of an input signal is greater than or equal to a reference value, and outputs a signal having a predetermined strength by increasing the gain value when strength of the input signal is less than the reference value.

The conventional AGC circuit adjusts a power gain of a received signal so that an average power for a signal received for a particular period may remain at a predetermined target value. Generally, the average power for a received signal is represented by a Received Signal Strength Indicator (RSSI). Here, the predetermined target value becomes a target RSSI.

As described above, the conventional wireless communication system maintains the target RSSI at a predetermined level by means of the AGC circuit irrespective of the channel environment between a transmitter and a receiver.

For these reasons, in the channel environment for wireless communication where high-power interference signals are received as a received signal, quantization error may increase as an AGC operation is performed on the entire received signal including the interference signals based on the fixed target RSSI. The increase in quantization error causes performance degradation of the wireless communication system. Therefore, in the wireless environment where interference signals are present, the wireless communication system needs to provide an AGC method and apparatus for reducing quantization error that may occur for a received signal due to the interference signals.

SUMMARY OF THE INVENTION

To address the above-discussed deficiencies of the prior art, it is a primary aspect of the present invention to address at least the above-mentioned problems and/or disadvantages and to provide at least the advantages described below. Accordingly, an aspect of the present invention provides an apparatus and method for adaptively adjusting a target RSSI for AGC in a reception apparatus for a wireless communication system where interference signals are in existence.

Another aspect of the present invention provides an apparatus and method for adaptively adjusting a target RSSI for AGC taking interference signals into account in a reception apparatus for a wireless communication system.

Further another aspect of the present invention provides an apparatus and method for adaptively adjusting a target RSSI for AGC taking interference signals into account in a reception apparatus for a wireless communication system based on Orthogonal Frequency Division Multiplexing (OFDM).

Yet another aspect of the present invention provides an apparatus and method for adaptively adjusting a target RSSI for AGC taking interference signals into account in a reception apparatus for a wireless communication system supporting a full-duplex scheme.

Still another aspect of the present invention provides an apparatus and method for adaptively adjusting a target RSSI for AGC taking interference signals into account in a relay apparatus for a wireless communication system supporting a full-duplex scheme.

Still another aspect of the present invention provides an apparatus and method for adaptively adjusting a target RSSI for AGC taking into account performance degradation caused by an increase in quantization error in a reception apparatus for a wireless communication system.

Still another aspect of the present invention provides an apparatus and method for adaptively adjusting a target RSSI for AGC taking into account a Signal to Interference Ratio (SIR) and a Modulation and Coding Scheme (MCS) level associated with a maximum transfer rate in a reception apparatus, or a relay apparatus, for a wireless communication system.

Still another aspect of the present invention provides an apparatus and method for adaptively adjusting a target RSSI for AGC to reduce performance degradation caused by an increase in quantization error when a reception signal from a transmitter and high-power interference signals (i.e. signals that a relay transmits to a receiver) are simultaneously received at a receiver of a full-duplex relay that performs interference cancellation.

In accordance with one aspect of the present invention, there is provided an Automatic Gain Control (AGC) apparatus in a relay apparatus supporting a full-duplex scheme. The AGC apparatus includes a Signal to Interference Ratio (SIR) estimation block for estimating an SIR based on an interference signal estimated from a received signal and an interference-cancelled signal determined by canceling the estimated interference signal from the received signal; a target Received Signal Strength Indicator (RSSI) determination block for determining a target RSSI according to the estimated SIR; and an AGC block for adjusting a gain for the received signal based on the determined target RSSI.

In accordance with another aspect of the present invention, there is provided an Automatic Gain Control (AGC) method in a relay apparatus supporting a full-duplex scheme. The AGC method includes estimating a Signal to Interference Ratio (SIR) based on an interference signal estimated from a received signal and an interference-cancelled signal determined by canceling the estimated interference signal from the received signal; determining a target Received Signal Strength Indicator (RSSI) according to the estimated SIR; and adjusting a gain for the received signal based on the determined target RSSI.

Other aspects, advantages, and salient features of the invention will become apparent to those skilled in the art from the following detailed description, which, taken in conjunction with the annexed drawings, discloses exemplary embodiments of the invention.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, the same drawing reference numerals will be understood to refer to the same elements, features and structures.

DETAILED DESCRIPTION OF THE INVENTION

Figure 1:
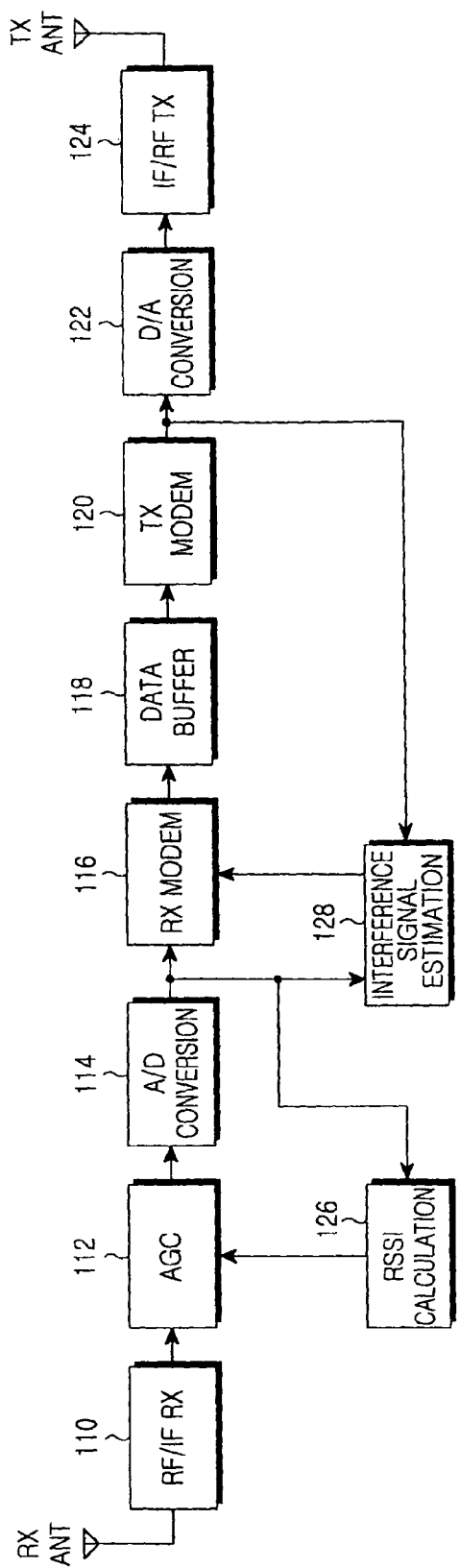
FIG. 1 illustrates a structure of a full-duplex relay according to an exemplary embodiment of the present invention.

FIGS. 1 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communications system.

The terms and words used in the following description and claims are not limited to the bibliographical meanings, but, are merely used to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The present invention provides an apparatus and method for adaptively adjusting a reference value, i.e., a target RSSI, for AGC taking interference signals into account in a reception apparatus with an AGC circuit for a wireless communication system. A Signal to Interference Ratio (SIR) may be used to consider interference signals in adaptively adjusting the target RSSI. It will be apparent to those skilled in the art that the target RSSI may be adaptively adjusted based not only one the SIR, but also on information indicating strength of interference signals included in a received signal.

The present invention may further consider an MCS level associated with the maximum transfer rate (hereinafter referred to as a "maximum-rate MCS level") in adaptively adjusting a target RSSI for AGC to prevent performance degradation caused by quantization error.

In exemplary embodiments of the present invention, a detailed description will be made of a method for estimating an SIR, a method for determining a target RSSI using the estimated SIR, and a method for adjusting a gain for a received signal based on the determined target RSSI.

An additional method will also be described in detail that determines a target RSSI by further considering a maximum-rate MCS level to prevent performance degradation caused by quantization error.

In the following detailed description, it is assumed that the present invention is applied to a relay apparatus proposed for multi-hop transmission technology in the wireless communication system. However, the method suggested by the present invention may also be applied to a reception apparatus for a common wireless communication system in the same way.

Generally, in order to apply the multi-hop transmission technology in the wireless communication system, one or more relay apparatuses are provided in series between a transmitter and a receiver, to relay necessary data. This is called a multi-hop relay scheme.

A wireless communication system using this multi-hop relay scheme may reconstruct a network in quick response to a change in communication environment, and can more efficiently manage the overall wireless network. The use of the multi-hop relay scheme can effectively provide communication services to users in the cell boundary area or shadow area where the channel environment between a base station and terminals is poor.

Accordingly, the relay apparatus includes a receiver and a transmitter, and implements an operation of amplifying a signal received through the receiver and transmitting the amplified signal through the transmitter. Thus, the transmission signal from the transmitter may act as an interference signal to the signal that is received at the receiver. In some applications, the relay may not be able to transmit and receive signals using the same frequency resources at the same time due to the interference that the transmission signal to a terminal gives to the received signal from the base station.

In some embodiments the relay apparatus is able to use different wireless resources for transmission and reception. However, this method may limit the wireless resources that the relay apparatus can use, causing a drastic decline in system capacity.

To make up for the shortcomings, full-duplex relay technology has been proposed that allows a relay to transmit and receive signals using the same wireless resources by applying interference cancellation technology to the relay in a wireless communication system, thereby increasing a transmission capacity of the relay. In a full-duplex relay apparatus (i.e., a relay supporting a full-duplex scheme), a receiver simultaneously receives a signal (or a source received signal) received from a transmitter such as a base station, and a signal (or an interference signal) transmitted from a transmitter of a relay apparatus. Generally, the interference signal is received with higher power compared with the source received signal.

In this case, as an AGC circuit in the relay apparatus performs power control according to the entire received signal to which the source received signal and the interference signal are added, an RSSI of the received signal is significantly reduced compared with the target RSSI, after the received signal undergoes interference cancellation in a base band. Therefore, a method and apparatus for determining an optimal target RSSI for AGC taking strength of interference signals into account will be described in detail below.

Exemplary embodiments of the present invention will now be described in detail with reference to the accompanying drawings.

FIG. 1 illustrates a structure of a relay supporting a full-duplex scheme (hereinafter referred to as a "full-duplex relay") according to an exemplary embodiment of the present invention. The full-duplex relay illustrated in FIG. 1 includes a Radio Frequency (RF)/Intermediate Frequency (IF) receiving block 110, an AGC block 112, an Analog-to-Digital (A/D) conversion block 114, an RSSI calculation block 126, a receiving modem 116, a data buffer 118, a transmitting modem 120, a Digital-to-Analog (D/A) conversion block 122, an IF/RF transmitting block 124, and an interference signal estimation block 128.

Referring to FIG. 1, a signal received via a receive antenna is provided to the receiving modem 116 through the RF/IF receiving block 110, the AGC block 112 and the A/D conversion block 114. The receiving modem 116 performs demodulation and decoding on the received signal and transfers it to the data buffer 118. The transmitting modem 120 generates a transmission signal by encoding and modulating data stored in the data buffer 118, and provides it to the D/A conversion block 122. An output signal of the D/A conversion block 122 is transmitted via a transmit antenna by means of the IF/RF transmitting block 124.

The RSSI calculation block 126 calculates an RSSI of a signal output from the A/D conversion block 114, and provides the calculated RSSI to the AGC block 112.

Meanwhile, the output signal of the A/D conversion block 114 is provided to the interference signal estimation block 128. The interference signal estimation block 128 estimates an interference channel using the signal output from the A/D conversion block 114 and the transmission signal output from the transmitting modem 120, and estimates an interference signal taking the estimated interference channel into account. The interference signal estimation block 128 provides the estimated interference signal to the receiving modem 116.

The receiving modem 116 cancels the estimated interference signal from the signal output from the A/D conversion block 114, and then performs data demodulation and decoding.

A. First Exemplary Embodiment

In a first exemplary embodiment of the present invention, an apparatus and method will be described in detail that estimates an interference signal and controls a gain for a received signal using a target RSSI determined based on the estimated interference signal. That is, a detailed description will be made of a structure for estimating an interference signal from a received signal, a structure for estimating an SIR based on the estimated interference signal, a structure for determining a target RSSI according to the estimated SIR, and a structure for adjusting a gain for the received signal based on the determined target RSSI.

Figure 2:
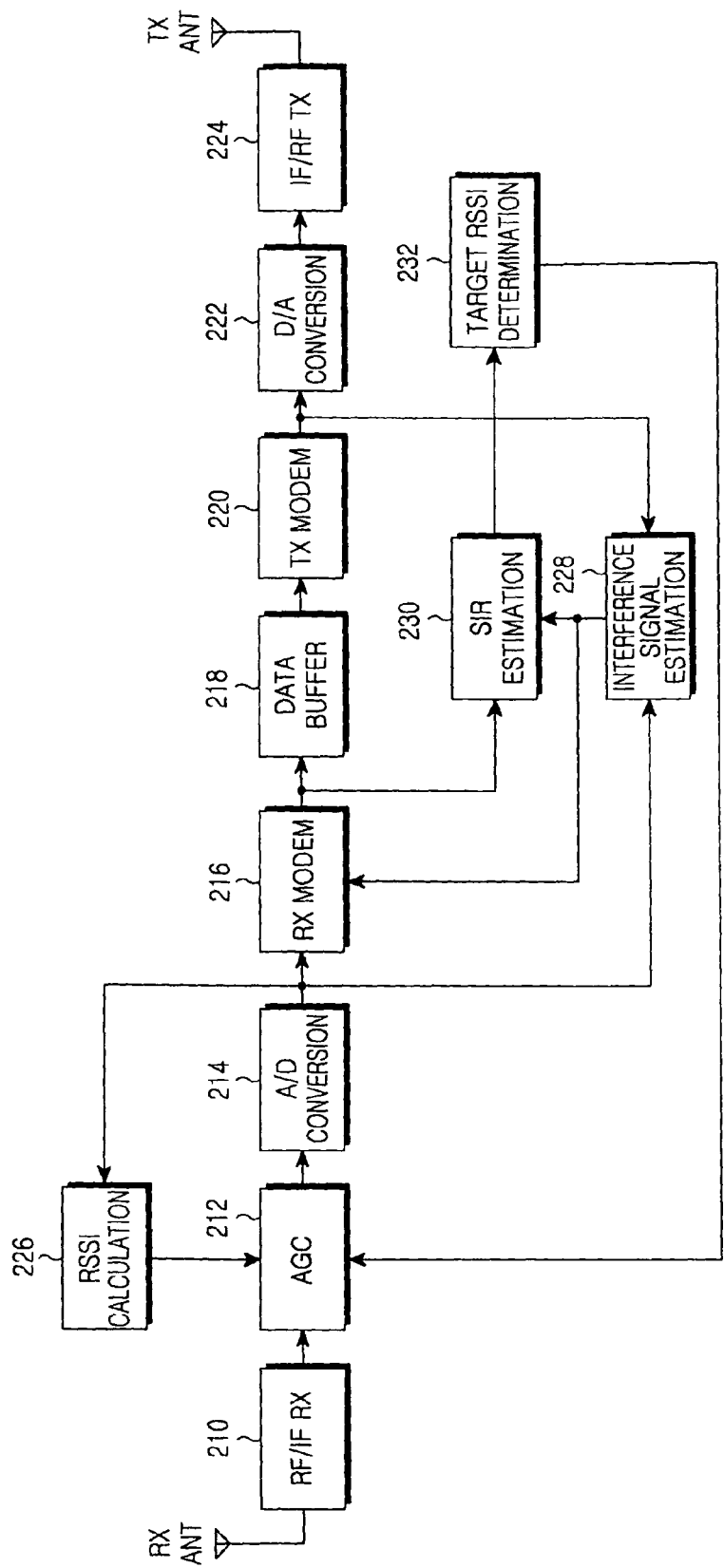
FIG. 2 illustrates a structure of a full-duplex relay that sets a target RSSI for AGC according to one embodiment of the present invention.

FIG. 2 illustrates a structure of a full-duplex relay that sets a target RSSI for AGC according to a first exemplary embodiment of the present invention.

Referring to FIG. 2, an RF-band radio signal received via a receive antenna is provided to an RF/IF receiving block 210. The RF/IF receiving block 210 converts the RF-band radio signal into an IF-band radio signal, and converts the IF-band radio signal into a base-band radio signal. The base-band radio signal is provided to an AGC block 212.

The AGC block 212 controls a gain for the base-band radio signal, and outputs the gain-controlled radio signal. The AGC block 212 considers a target RSSI in controlling a gain for the base-band radio signal. The target RSSI is determined depending on an interference signal estimated from the received signal. For example, the target RSSI is adjusted according to an SIR calculated based on the estimated interference signal. A method for determining the target RSSI will be described in detail below.

An A/D conversion block 214 converts the gain-controlled radio signal into a digital-type radio signal (hereinafter referred to as a "digital received signal"). The digital received signal is provided to an RSSI calculation block 226, a receiving modem 216, and an interference signal estimation block 228. The RSSI calculation block 226 calculates an RSSI of the digital received signal and provides the calculated RSSI to the AGC block 212.

The receiving modem 216 cancels an estimated interference signal from the digital received signal provided from the A/D conversion block 214. The estimated interference signal is provided from the interference signal estimation block 228.

Meanwhile, the receiving modem 216 performs demodulation and decoding on the digital received signal from which the estimated interference signal is cancelled. A demodulation scheme for the demodulation and a decoding scheme for the decoding are determined by resource allocation information (MAP) provided from a base station. For example, the receiving modem 216 performs demodulation and decoding on the interference-cancelled digital received signal based on a demodulation scheme and a decoding scheme that are determined according to an MCS level provided through the MAP information. An output signal demodulated and decoded by the receiving modem 216 is equivalent to a source signal (or a source received signal) transmitted from a transmission side. In other words, the output signal demodulated and decoded by the receiving modem 216 corresponds to a source signal in which a characteristic of a channel to the transmission side is reflected.

The received signal demodulated and decoded by the receiving modem 216 is provided to a data buffer 218 and an SIR estimation block 230. The data buffer 218 buffers the received signal provided from the receiving modem 216, in a transmitting modem 220.

The transmitting modem 220 performs encoding and modulation on the received signal buffered in the data buffer 218. An encoding scheme for the encoding and a modulation scheme for the modulation are determined by MAP information that is provided from a base station or generated by the relay itself. For example, the transmitting modem 220 performs encoding and modulation on the received signal based on an encoding scheme and a modulation scheme that are determined according to an MCS level provided from the MAP information.

The transmission signal output from the transmitting modem 220 is provided to a D/A conversion block 222 and the interference signal estimation block 228.

The D/A conversion block 222 converts the digital received signal provided from the transmitting modem 220 into an analog-type transmission signal. The analog transmission signal is provided to an IF/RF transmitting block 224. The IF/RF transmitting block 224 converts a base-band transmission signal into an RF-band transmission signal by way of an IF-band transmission signal. The RF-band transmission signal is transmitted via a transmit antenna.

The interference signal estimation block 228 receives the digital received signal provided from the receiving modem 216 and the transmission signal output from the transmitting modem 220.

The received signal Y provided from the receiving modem 216 can be defined as in Equation 1:

$$Y = H_x \cdot S_x + H_i \cdot S_i + n \quad \text{[Eqn. 1]}$$

where $S_x$ denotes a source signal transmitted from a transmission side (e.g. a base station), $H_x$ denotes a characteristic of a channel to the transmission side, $S_i$ denotes a signal transmitted through a transmit antenna included in a relay apparatus, $H_i$ denotes a characteristic of a channel to the transmit antenna included in the relay apparatus, and n represents a noise component. Thus, $H_i \cdot S_i$ in Equation 1 corresponds to an interference signal component.

Further, the interference signal estimation block 228 estimates a characteristic of an interference channel using the received signal provided from the receiving modem 216 and the transmission signal output from the transmitting modem 220. That is, the interference signal estimation block 228 estimates $H_1$ from $H_i \cdot S_i$ that is defined as interference component in Equation 1.

In Equation 1, a source signal component $H_x \cdot S_x$ may be assumed to be significantly less than the interference signal component $H_i \cdot S_i$. This assumption is possible because it can be considered that a signal transmitted via a relay's transmit antenna, which acts as an interference signal, has a relatively greater value than a source signal transmitted from a transmission side. In view of the assumption, the source signal component $H_x \cdot S_x$ is negligible in Equation 1.

Therefore, if the transmission signal output from the transmitting modem 220 is regarded as the signal transmitted via the transmit antenna, i.e., $S_i$ in Equation 1, a characteristic $H_i$ of an interference channel can be estimated using Y and $S_i$.

When the characteristic $H_i$ of an interference channel is estimated, the interference signal estimation block 228 estimates an interference signal $H_i \cdot S_i$ based on the estimated interference channel's characteristic $H_i$ and the transmission signal from the transmitting modem 220.

The interference signal estimation block 228 provides the estimated interference signal to the SIR estimation block 230 and the receiving modem 216. The receiving modem 216, as described above, can acquire an interference-cancelled received signal by canceling the estimated interference signal from the received signal. That is, the receiving modem 216 can obtain a desired received signal $H_i \cdot S_x$ by canceling the interference signal $H_i \cdot S_i$ from the received signal represented by Equation 1.

Meanwhile, the SIR estimation block 230 receives the received signal output from the receiving modem 216, i.e., the interference-cancelled received signal $H_x \cdot S_x$, and the interference signal $H_i \cdot S_i$ estimated by the interference signal estimation block 228. The SIR estimation block 230 estimates an SIR for the received signal taking $H_x \cdot S_x$ and $H_i \cdot S_i$ into account. The SIR can be estimated by dividing power of the received signal $H_x \cdot S_x$ by power of the interference signal $H_i \cdot S_i$. The SIR value estimated by the SIR estimation block 230 is provided to a target RSSI determination block 232.

The target RSSI determination block 232 determines a target RSSI using the SIR estimate (i.e. the estimated SIR value) provided from the SIR estimation block 230. The target RSSI determination block 232 may preset a target RSSI that is optimized for each of the determined SIR levels.

The target RSSI optimized for each of the SIR levels is determined so as to minimize quantization error that occurs by converting an analog received signal into a digital received signal. The optimized target RSSI is set as a value for minimizing clipping-caused performance degradation due to an AGC operation by the AGC block 212.

For example, it can be preferable to increase the target RSSI little by little in order to reduce performance degradation caused by an increase in quantization error of the received signal after interference cancellation. However, in the event that the target RSSI exceeds a predetermined value, performance degradation caused by clipping may occur as frequency of saturation may increase that the entire received signal including the interference signal, which is received as an input to the A/D conversion block 214, exceeds the maximum input level of the A/D conversion block 214 because of the exceeding of the target RSSI. Therefore, it is possible to determine the target RSSI for each SIR level such that performance degradation caused by the quantization error and clipping is minimized.

From this point of view, the target RSSI determination block 232 may set an optimal target RSSI according to an input SIR estimate based on pre-designed simulation results.

Conversely, the target RSSI determination block 232 determines or selects a target RSSI corresponding to the estimated SIR value from among target RSSIs that were preset for respective SIR levels.

Table 1 below illustrates examples of target RSSIs that were preset for individual SIR levels.

TABLE 1

| Index | SIR estimate | target RSSI |
| --- | --- | --- |
| 1 | SIR #1 | RSSI_target #1 |
| 2 | SIR #2 | RSSI_target #2 |
| 3 | SIR #3 | RSSI_target #3 |
| ... | ... | ... |
| N | SIR #n | RSSI_target #n |

In Table 1, it is assumed that as the index increases, the SIR estimate decreases. Then, as the index increases step by step, strength of an interference signal being input to a receiver of the relay apparatus becomes greater than that of the source received signal. Therefore, an RSSI value given after interference cancellation is significantly reduced compared with the target RSSI.

When the RSSI value after interference cancellation is reduced in this way, the target RSSI determination block 232 increases strength of a desired received signal by increasing a value of the target RSSI, thus making it possible to inhibit performance degradation caused by an increase in quantization error.

Therefore, simulation can be conducted that determines an optimal target RSSI capable of reducing performance degradation caused by an increase in quantization error, according to the SIR estimates shown in Table 1.

The target RSSI determined by the target RSSI determination block 232 is fed back to the AGC block 212 and used to adjust a gain of the received signal provided from the RF/IF receiving block 210.

As described above, when an SIR value is smaller, the interference signal has a greater value than the desired received signal. For this reason, the received signal given after canceling the interference signal therefrom is significantly reduced in RSSI, compared with the received signal before the cancellation of the interference signal. Therefore, the AGC circuit adjusts a gain associated with the target RSSI not based on the desired received signal, but based on the high-power interference signal. As a result, the RSSI value after interference cancellation is significantly reduced from the target RSSI, increasing performance degradation caused by an increase in quantization error. Conversely, when the SIR value is larger, the performance degradation caused by an increase in quantization error will not be significant even after the interference cancellation. Thus, the present invention can be applied generally to a full-duplex relay apparatus to reduce performance degradation caused by quantization error in the wireless communication environment where the SIR value is small.

Figure 3:
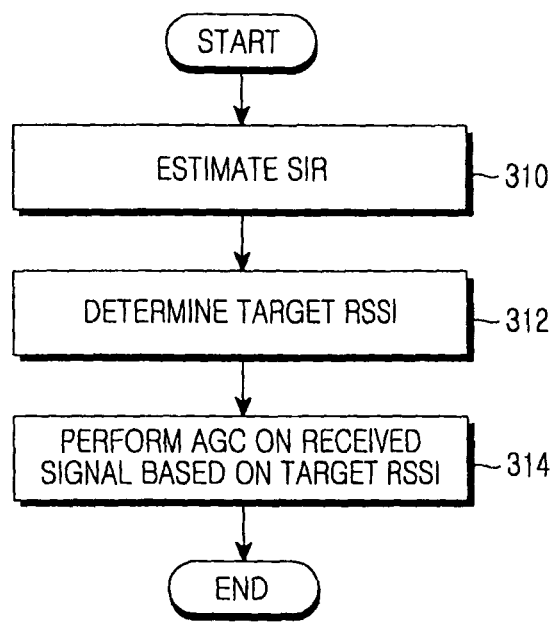
FIG. 3 illustrates a control flow for performing AGC in a full-duplex relay apparatus according to an exemplary embodiment of the present invention.

FIG. 3 illustrates a control flow for performing AGC in a full-duplex relay apparatus according to the first exemplary embodiment of the present invention.

Referring to FIG. 3, the relay apparatus performs an SIR estimation process in step 310. A detailed control flow of the SIR estimation process performed by an SIR estimation block will be described below with reference to FIG. 4.

Figure 4:
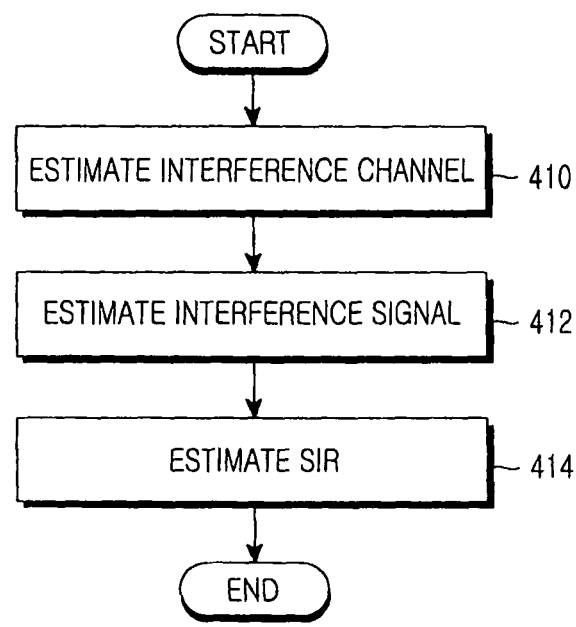
FIG. 4 illustrates a control flow for the SIR estimation performed by the SIR estimation block in a relay apparatus according to an exemplary embodiment of the present invention.

FIG. 4 illustrates a control flow for the SIR estimation performed by the SIR estimation block in the relay apparatus.

Referring to FIG. 4, the relay apparatus estimates an interference channel in step 410. The interference channel corresponds to a channel characteristic of an interference signal included in a received signal. Therefore, when the relay apparatus has a receiving modem and a transmitting modem, the interference channel can be estimated using a received signal being input to the receiving modem and a transmission signal output from the transmitting modem.

When the estimation of the interference channel is completed, the relay apparatus estimates an interference signal in step 412. The interference signal, which is an interference signal included in the received signal, is created by a signal transmitted via a transmit antenna in the relay apparatus.

Since a source signal component that is included in the received signal for estimation of the interference signal is a negligible value, the interference signal can be estimated from the received signal in consideration of the estimated interference channel.

When the estimation of the interference signal is completed, the relay apparatus estimates an SIR in step 414. The SIR can be estimated by dividing the power of the source signal component by the power of the estimated interference signal component. The source signal component can be acquired by canceling the estimated interference signal component from the received signal.

When the above-described SIR estimation process is completed, the relay apparatus shifts to step 312 where it determines a target RSSI. For this purpose, the relay apparatus presets optimal target RSSIs for individual SIR levels. The optimal target RSSIs may be preset based on pre-designed simulation results. Therefore, the relay apparatus determines or selects a target RSSI corresponding to the estimated SIR from among the optimal target RSSIs that were preset for individual SIRs.

After the target RSSI is determined, the relay apparatus performs AGC on the received signal based on the determined target RSSI in step 314. As the AGC on the received signal is performed taking into account the optimal target RSSI which is determined based on the interference signal, the performance degradation can be minimized.

Figure 5:
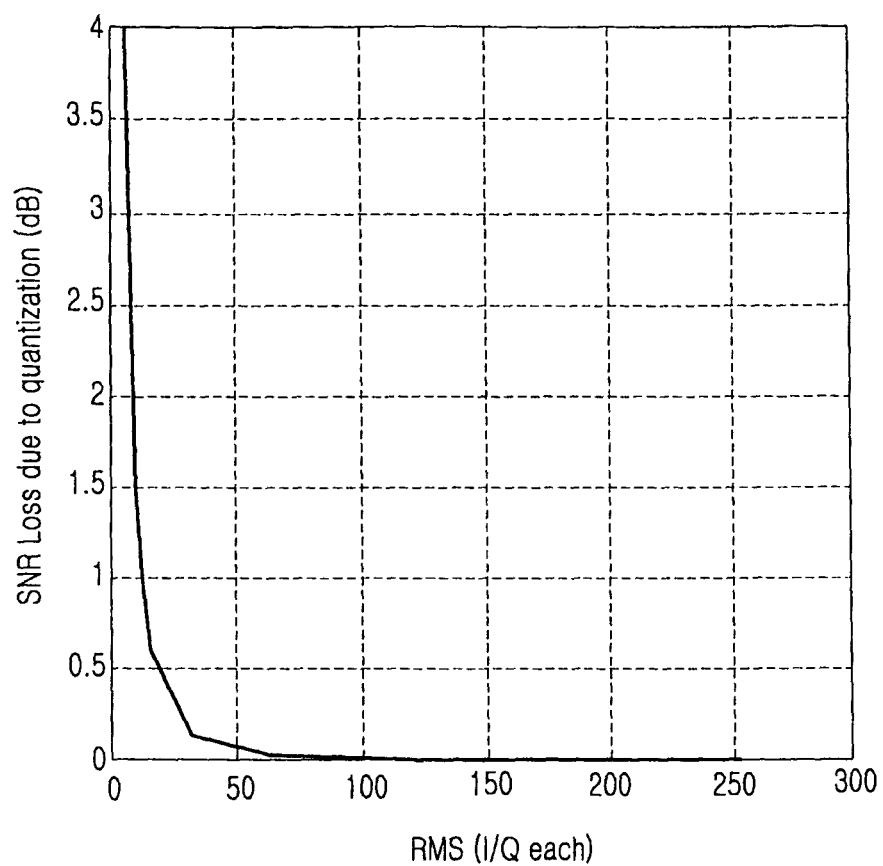
FIGS. 5 and 6 illustrate simulation results made on a relay apparatus to which an exemplary embodiment of the present invention is applied.
Figure 6:
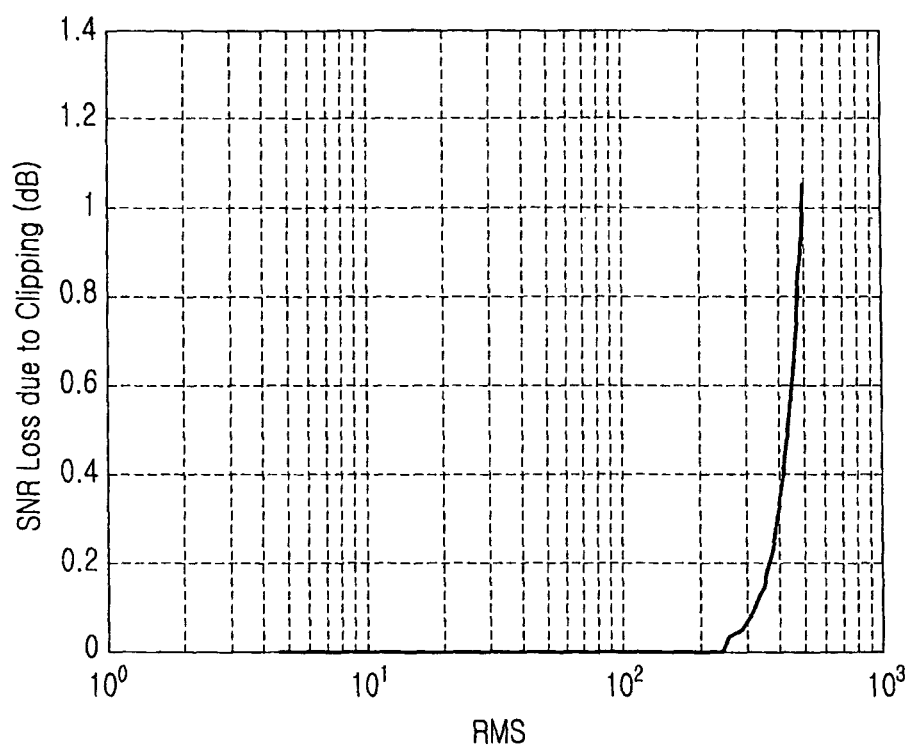

FIG. 5 is a graph illustrating performance degradation caused by quantization with respect to an increase in target Root Mean Square (RMS), and FIG. 6 is a graph illustrating performance gradation caused by clipping with respect to an increase in target RMS.

A detailed description will now be made of a method for determining an optimal target RSSI taking into account the simulation results shown in FIGS. 5 and 6.

It can be appreciated from FIG. 5 that performance degradation caused by quantization error changes according to an increase in the target RMS. Given that probabilistic characteristics of I and Q are equal, the target RMS, which is a mathematical expression of a target RSSI for the simulation of FIG. 5, is defined as Equation 2:

$$\text{Target } RSSI = 2 * (\text{Target } RMS)^2. \qquad [\text{Eqn. 2}]$$

As can be seen from the simulation results, the performance degradation due to quantization error is reduced by increasing the target RMS.

Meanwhile, FIG. 6 shows that performance degradation caused by clipping increases with the target RMS.

As illustrated by the foregoing, the target RMS may reduce the performance degradation caused by quantization error to some extent, but its continuous increase may incur the performance degradation by clipping. Accordingly, there is a need for determining a target RSSI to minimize the total performance degradation by considering both the performance degradation caused by quantization error and the performance degradation by clipping.

The target RSSI determination block receives an SIR value from the SIR estimation block, and can determine an RMS difference between the interference signal and the interference-cancelled signal according to the SIR value. A sum of the performance degradation by clipping, which occurs for a particular RMS value, and the performance degradation by quantization, which occurs for an RMS value being different from the particular RMS by the SIR, becomes the total performance degradation that occurs due to clipping and quantization for the particular RMS value.

For example, when SIR=−20 dB (when the interference signal is 100 times greater than the interference-cancelled signal), a sum of the clipping-caused performance degradation for RMS=100 and the quantization-caused performance degradation for RMS=10 is the total performance degradation when AGC is performed with RMS remained at 100.

Therefore, the particular RMS value to minimize the total performance degradation is determined as a target RMS for AGC.

B. Second Exemplary Embodiment

In a second exemplary embodiment of the present invention, an apparatus and method will be described in detail that determines a target RSSI by further considering an MCS level except the estimated interference signal, and adjusts a gain for a received signal using the determined target RSSI. For example, a structure of a new relay apparatus is proposed that further includes a structure for discriminating an MCS level in addition to the structure of the relay apparatus proposed in the first exemplary embodiment of the present invention.

A maximum-rate MCS level discrimination block that is further included in the second exemplary embodiment of the present invention, performs an operation of detecting a maximum-rate MCS level for each individual AGC unit using resource allocation information (e.g. MAP information) in order to determine a target RSSI.

The unit in which AGC is performed in the wireless communication system may be different according to each standard. Commonly, the unit in which AGC is performed can become a modulation symbol or a frame. A typical example that performs AGC in units of the modulation symbols or frames may include a wireless communication system based on Orthogonal Frequency Division Multiplexing (OFDM), such as IEEE 802.16e and IEEE 802.16m. For example, in a wireless communication system supporting IEEE 802.16m, AGC can be performed on a sub-frame by sub-frame basis or on a super-frame by super-frame basis, which is considered in the standard.

Specifically, an AGC operation measures an RSSI for a particular bundle of resources and adjusts attenuation/gain of an RF/IF receiving block to be applied to the next bundle of resources. The bundle of resources, which becomes a unit in which AGC is performed, is called an 'AGC unit'.

Meanwhile, the second exemplary embodiment of the present invention further considers an MCS level in determining the target RSSI, for the following reasons.

Commonly, when a wireless communication system performs AGC on a received signal including an interference signal, AGC is defined such that an influence of quantization error for a maximum-rate MCS level should be less than a specific designed value. If a maximum-rate MCS level used in an AGC unit supports a rate lower than that of the maximum-rate MCS level defined in the standard, it shows higher robustness against the performance degradation caused by quantization error. In this case, therefore, there is a room to lower a target RSSI in order to reduce the performance degradation by clipping.

Therefore, the embodiment may determine an optimal target RSSI by further considering an MCS level so that the total performance degradation can be reduced that includes the performance degradation due to quantization error.

To sum up, an SIR estimate is basically used as in the first exemplary embodiment in order to determine an optimal target RSSI for AGC. The target RSSI can be lowered below a value designed at an initial AGC stage when the maximum-rate MCS level used in the AGC unit is lower than the maximum-rate MCS level defined in the standard.

Therefore, the second exemplary embodiment of the present invention adjusts a gain of a received signal by feeding back an optimal target RSSI determined using an SIR estimation block and a maximum-rate MCS level discrimination block, to an AGC device.

An operation according to the second exemplary embodiment of the present invention will be described in detail below.

Figure 7:
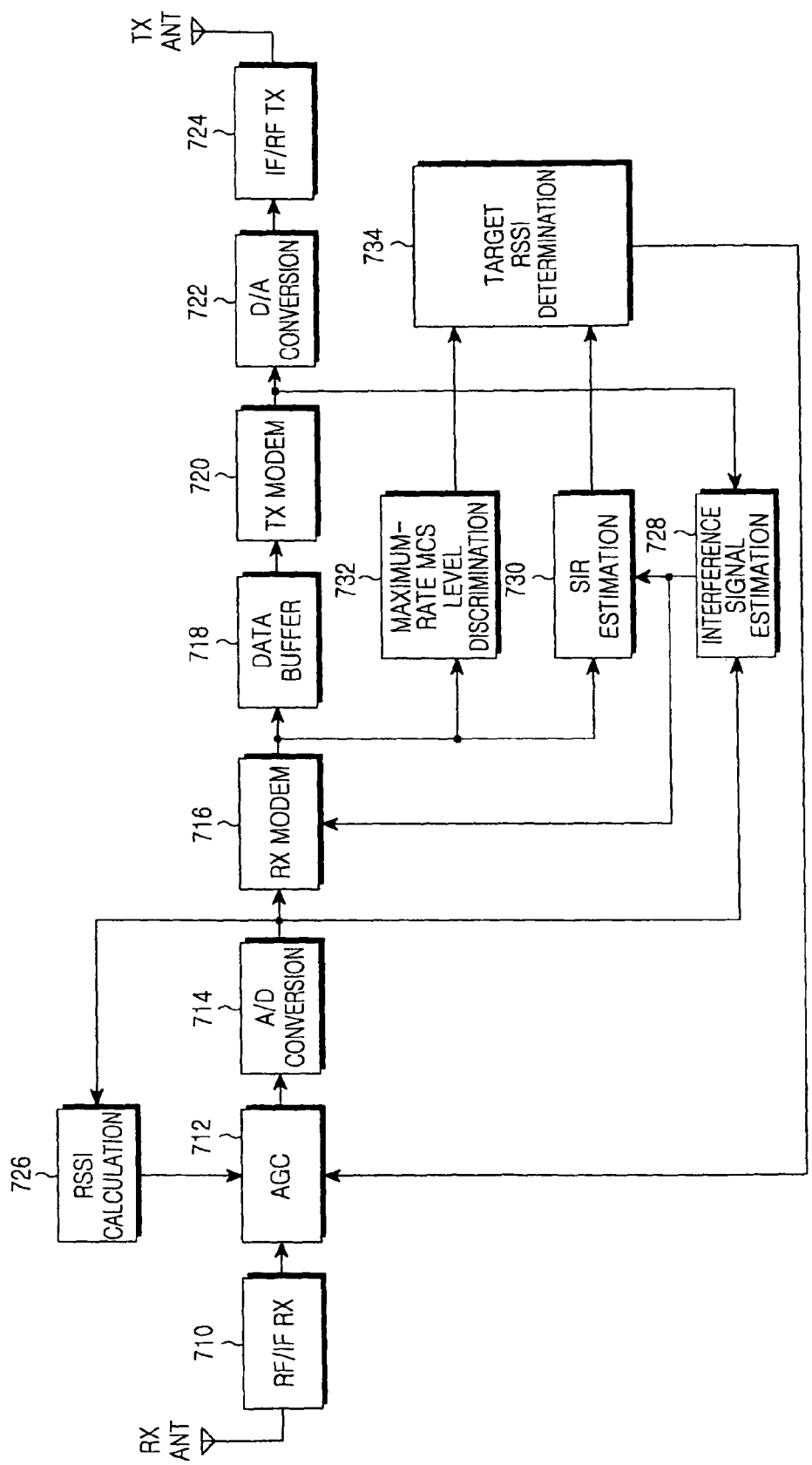
FIG. 7 illustrates a structure of a full-duplex relay that sets a target RSSI for AGC according to one embodiment of the present invention.

FIG. 7 illustrates a structure of a full-duplex relay that sets a target RSSI for AGC according to the second exemplary embodiment of the present invention.

Referring to FIG. 7, an RF-band radio signal received via a receive antenna is provided to an RF/IF receiving block 710.

The RF/IF receiving block 710 converts the RF-band radio signal into a base-band radio signal.

An AGC block 712 controls a gain for the base-band radio signal, and outputs the gain-controlled radio signal. The AGC block 712 considers a target RSSI in controlling a gain for the base-band radio signal. The target RSSI is determined by considering an MCS level used for demodulation and decoding of the received signal. The determination of the target RSSI will be described in detail below.

An A/D conversion block 714 converts the gain-controlled radio signal into a digital received signal. An RSSI calculation block 726 calculates an RSSI of the digital received signal, and provides it to the AGC block 712.

A receiving modem 716 cancels an interference signal from the digital received signal provided from the A/D conversion block 714. The interference signal is estimated and provided by an interference signal estimation block 728.

Meanwhile, the receiving modem 716 performs demodulation and decoding on the digital received signal from which the estimated interference signal is cancelled. A demodulation scheme for the demodulation and a decoding scheme for the decoding are determined by an MCS level.

The output signal demodulated and decoded by the receiving modem 716 is equivalent to a source signal transmitted from a transmission side. That is, the output signal demodulated and decoded by the receiving modem 716 corresponds to a source signal that is affected by a channel to the transmission side.

A data buffer 718 buffers the received signal provided from the receiving modem 716, in a transmitting modem 720.

The transmitting modem 720 performs encoding and modulation on the received signal buffered in the data buffer 718.

A D/A conversion block 722 converts the digital transmission signal provided from the transmitting modem 720 into an analog transmission signal. An IF/RF transmitting block 724 converts a base-band transmission signal into an RF-band transmission signal, and transmits it via a transmit antenna.

The interference signal estimation block 728 estimates an interference signal based on the digital received signal provided from the receiving modem 716 and the transmission signal output from the transmitting modem 720. An operation of the interference signal estimation block 728 is equal to the operation of estimating an interference signal, which has been described in the first exemplary embodiment.

The receiving modem 716 cancels the interference signal from the input received signal using the estimated interference signal provided from the interference signal estimation block 728.

Meanwhile, an SIR estimation block 730 receives a received signal output from the receiving modem 716, i.e., an interference-cancelled signal, and the interference signal estimated by the interference signal estimation block 728. The SIR estimation block 730 estimates an SIR for the received signal taking into account the interference-cancelled signal and the estimated interference signal.

A maximum-rate MCS level discrimination block 732 receives a maximum-rate MCS level for each individual AGC unit from the receiving modem 716. That is, when a base station includes resource allocation information in the transmission signal and transmits the resource allocation information with data, a receiving side acquires a maximum-rate MCS level for each AGC unit from the resource allocation information.

A target RSSI determination block 734 determines an optimal target RSSI using the maximum-rate MCS level provided from the maximum-rate MCS level discrimination block 732 and the SIR value provided from the SIR estimation block 730.

That is, the target RSSI determination block 734 considers the maximum-rate MCS level for each AGC unit so as to minimize the total performance degradation in which the performance degradation due to quantization error and the performance degradation by clipping are taken into account. A detailed method will be described below in which the target RSSI determination block 734 determines an optimal target RSSI using the SIR value and the maximum-rate MCS level.

When the target RSSI is fed back to the AGC block 704, the AGC block 704 adjusts a gain of the received signal based on the target RSSI.

Detailed operations of the above elements in the foregoing description have been fully described in the first exemplary embodiment of the present invention. Therefore, for more details about the operations, reference can be made to the description given in the first exemplary embodiment.

Figure 8:
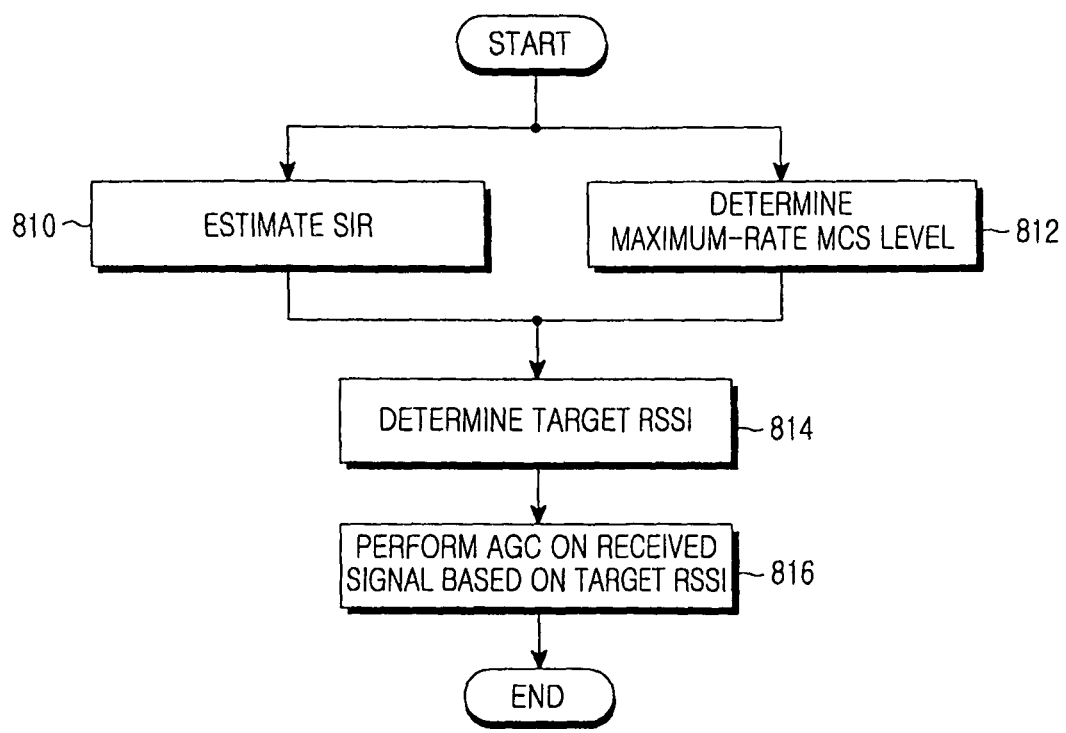
FIG. 8 illustrates a control flow for performing AGC in a full-duplex relay apparatus according to an exemplary embodiment of the present invention.

FIG. 8 illustrates a control flow for performing AGC in a full-duplex relay apparatus according to the second exemplary embodiment of the present invention.

Referring to FIG. 8, the relay apparatus performs an SIR estimation process in step 810. A detailed operation of the SIR estimation process has been fully described with reference to FIG. 4 in the first exemplary embodiment of the present invention.

In step 812, the relay apparatus determines a maximum-rate MCS level for each individual AGC unit. The maximum-rate MCS level is discriminated based on resource allocation information received from a base station.

After the SIR estimation and the determination of the maximum-rate MCS level for each AGC unit are completed, the relay apparatus determines a target RSSI in step 814. For this, optimal target RSSIs are set in advance by considering the SIR and the maximum-rate MCS level. The optimal target RSSIs can be preset based on the pre-designed simulation results. Therefore, the relay apparatus determines or selects a target RSSI corresponding to the estimated SIR and the determined maximum-rate MCS level from among the preset optimal target RSSIs.

After the target RSSI is determined, the relay apparatus performs AGC on the received signal based on the determined target RSSI in step 816. The AGC on the received signal may minimize the performance degradation by considering the optimal target RSSI that is determined depending on the interference signal and the MCS level.

Figure 9:
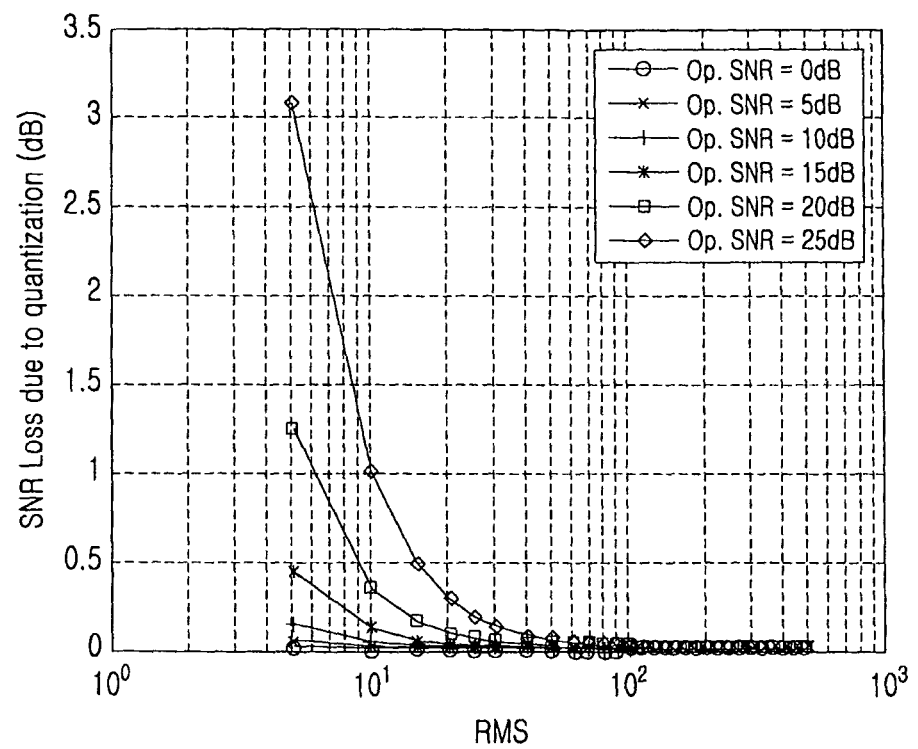
FIGS. 9 and 10 illustrate simulation results made on a relay apparatus to which an exemplary embodiment of the present invention is applied.
Figure 10:
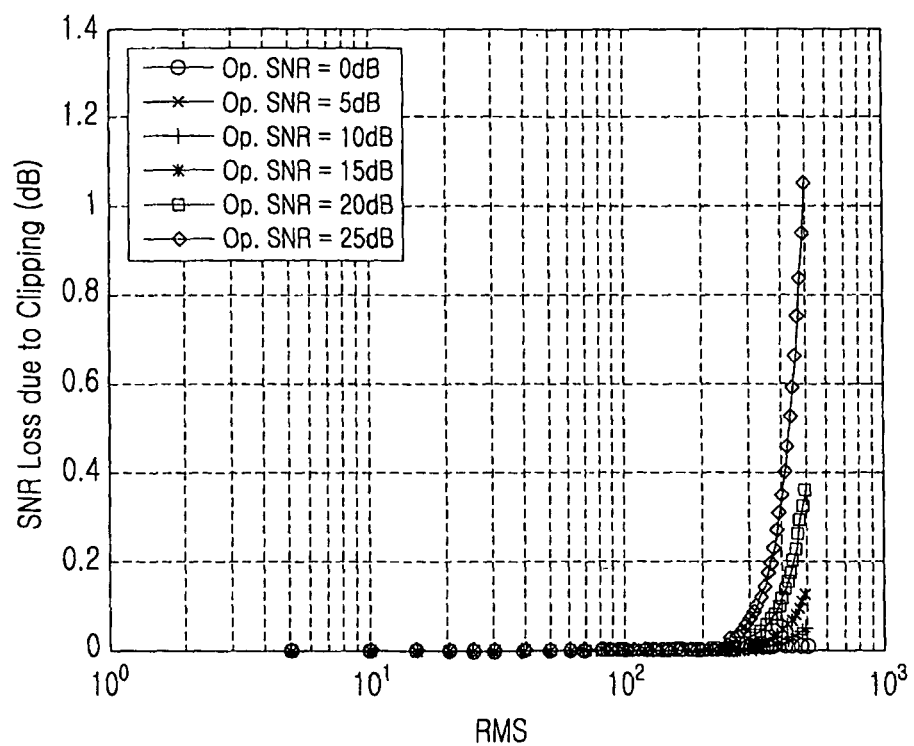

FIG. 9 is a graph illustrating a level of performance degradation (Signal to Noise Ratio (SNR) degradation) caused by quantization error with respect to an operating SNR, and FIG. 10 is a graph illustrating a level of performance degradation caused by clipping with respect to an operating SNR. FIGS. 9 and 10 show simulation results according to the second exemplary embodiment of the present invention.

A detailed description will now be made of a method for determining an optimal target RSSI by considering the simulation results shown in FIGS. 9 and 10.

AGC is generally designed such that performance degradation due to quantization error should be below a predetermined level with regard to the maximum-rate MCS level in the standard, which needs the highest required SNR. Therefore, when the maximum-rate MCS level used in the AGC unit is lower than the maximum-rate MCS level in the standard, the performance degradation due to quantization error for the AGC unit may be less than a target value even though the target RSSI is lowered below a value designed at an initial AGC stage.

It can be seen from FIG. 9 that for individual operating SNRs, performance degradation due to quantization error decreases as a target RMS increases. In addition, a change in performance degradation due to quantization error significantly increases with the operating SNR.

Generally, if an SNR increases, the maximum-rate MCS level used by a full-duplex relay apparatus also increases, making it possible to obtain a higher data rate. Therefore, the operating SNR in the simulation is a value that is experimentally simulated to consider the maximum-rate MCS level. That is, the operating SNR corresponds to the maximum-rate MCS level.

FIG. 10 shows that for individual operating SNRs, performance degradation due to clipping increases with the target RMS. In addition, a change in performance degradation due to clipping significantly increases with the operating SNR.

As such, since the performance degradation due to quantization error decreases with a decrease in the operating SNR, the performance degradation caused by quantization error for the AGC unit may be less than a target value even though the target RMS is reduced. In addition, as the operating SNR is lower, the clipping begins at a greater target RMS, and the performance degradation due to clipping also decreases. Therefore, the optimal target RSSI can be determined by further considering the operating SNR.

The target RSSI determination block determines an optimal target RSSI using the SIR estimate and the maximum-rate MCS level, the optimal target RSSI being preset taking into account both the performance degradation due to quantization error and the performance degradation due to clipping.

C. Implementation

An example of an OFDM wireless communication system will now be described in detail, to which an AGC technique proposed by the first and second exemplary embodiments of the present invention is applied.

An OFDM-based full-duplex relay apparatus with a target RSSI application function according to an implementation of the present invention will be described in detail with reference to FIG. 11.

Figure 11:
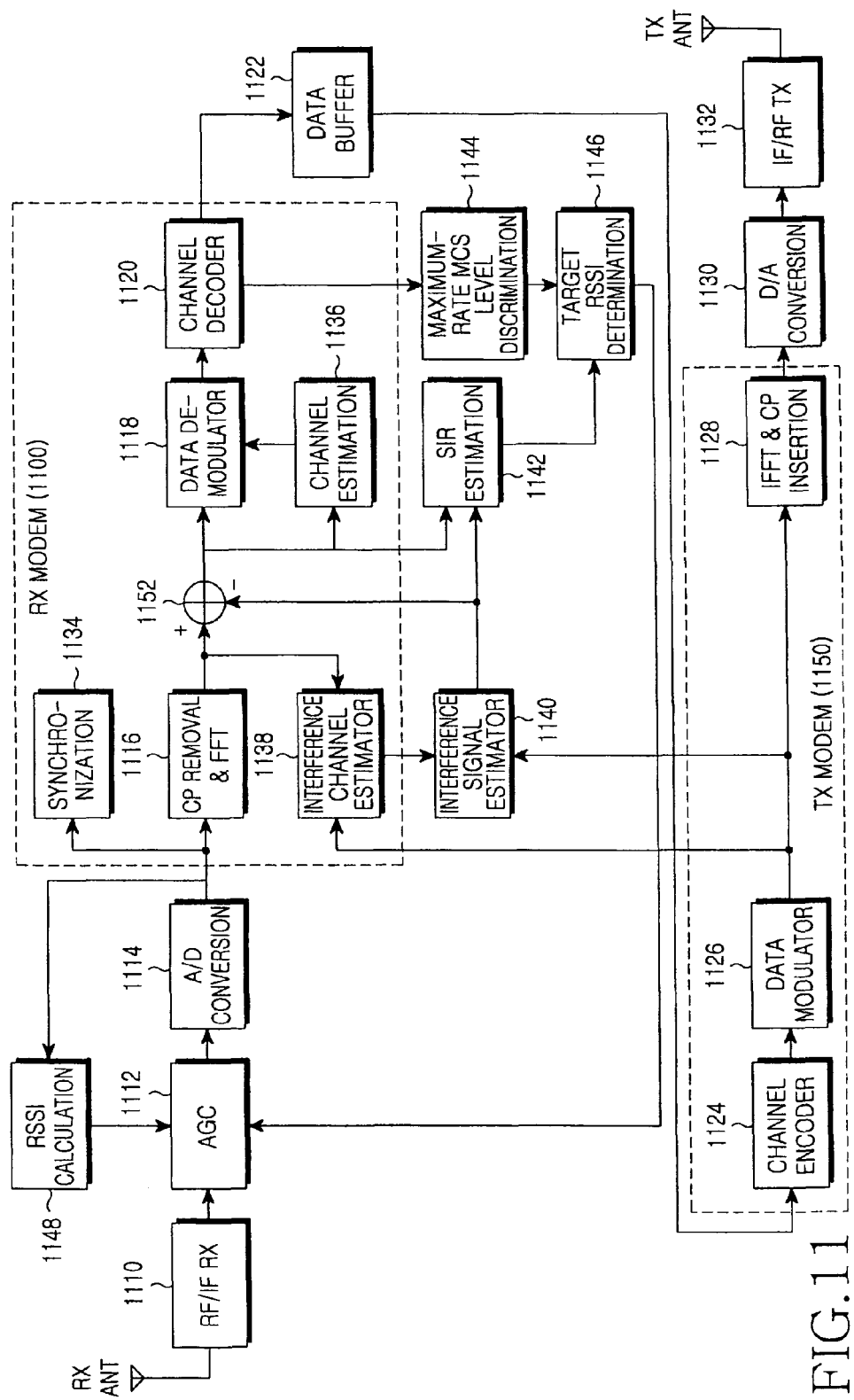
FIG. 11 illustrates a structure of an OFDM-based full-duplex relay apparatus that sets a target RSSI for AGC according to an implementation of the present invention.

Referring to FIG. 11, a receiving modem 1100 includes a Cyclic Prefix (CP) removal & Fast Fourier Transform (FFT) block 1116, a synchronization block 1134, a subtractor 1152, a data demodulator 1118, a channel decoder 1120, a channel estimator 1136, and an interference channel estimator 1138. The interference channel estimator 1138 in the receiving modem 1100 may be implemented in a single structure united with an interference signal estimator 1140 as considered in the first and second exemplary embodiments.

The CP removal & FFT block 1116 removes a CP from a received signal output from an A/D conversion block 1114, and performs FFT on the CP-removed signal. The CP removal & FFT block 1116 provides its output signal to the interference channel estimator 1138. In addition, a transmission signal output from a data modulator 1126 in a transmitting modem 1150 is provided to the interference channel estimator 1138.

The interference channel estimator 1138 estimates an interference channel using the received signal before cancellation of interference and the transmission signal provided from the transmitting modem 1150.

The interference channel estimator 1138 neglects a noise component included in the received signal since it strength is very low. Further, because strength of an interference signal in the received signal is much higher than that of the received signal, the received signal also is neglected. Meanwhile, an interference component included in the received signal is assumed to be a signal component that is transmitted via a transmit antenna of the relay and received through a receive antenna of the relay. Thus, the interference channel estimator 1138 can estimate an interference channel on the assumption described above.

The interference signal estimator 1140 estimates an interference signal depending on a characteristic $H_i$ of the interference channel from the interference channel estimator 1138 and the transmission signal Si output from the transmitting modem 1150. As mentioned above, the transmission signal that is received at the interference signal estimator 1140 from the transmitting modem 1150 is assumed to be an interference signal received via a receive antenna of the relay.

The interference signal estimator 1140 provides the estimated interference signal to an SIR estimation block 1142 and the subtractor 1152 in the receiving modem 1100. The SIR estimation block 1142 estimates an SIR value using the estimated interference signal and the interference-cancelled signal. That is, an SIR estimate is calculated by dividing a power estimate of the interference-cancelled signal by power of the estimated interference signal.

The SIR estimate and a maximum-rate MCS level output from the maximum-rate MCS level discrimination block 1144 are provided to a target RSSI determination block 1146. The target RSSI determination block 1146 determines an optimal target RSSI for preventing performance degradation, using the SIR estimate and the maximum-rate MCS level. The target RSSI is fed back to an AGC block 1112, and the AGC block 1112 adjusts a gain of the received signal with regard to an AGC unit that is applied next.

So far, implementation of an OFDM-based wireless communication system has been described, to which the AGC technique proposed by the present invention is applied. The present invention can be applied to any other wireless communication systems having similar technical background and channel structure without departing from the spirit and scope of the invention.

As is apparent from the foregoing description, when a received signal from a base station's transmitter and a high-power interference signal are simultaneously received at a receiver of a full-duplex relay, the present invention can reduce the performance degradation caused by quantization error by using an AGC apparatus to which an adaptive target RSSI is applied, compared with the conventional AGC apparatus that does not consider interference.

Exemplary embodiments of the present invention can also be embodied as computer-readable codes on a computer-readable recording medium. The computer-readable recording medium is any data storage device that can store data which can thereafter be read by a computer system. Examples of the computer-readable recording medium include, but are not limited to, read-only memory (ROM), random-access memory (RAM), CD-ROMs, magnetic tapes, floppy disks, optical data storage devices, and carrier waves (such as data transmission through the Internet via wired or wireless transmission paths). The computer-readable recording medium can also be distributed over network-coupled computer systems so that the computer-readable code is stored and executed in a distributed fashion. Also, function programs, codes, and code segments for accomplishing the present invention can be easily construed as within the scope of the invention by programmers skilled in the art to which the present invention pertains.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An Automatic Gain Control (AGC) apparatus in a relay apparatus supporting a full-duplex scheme, the relay apparatus configured for communication between a base station and a terminal, the AGC apparatus comprising:
    a controller configured to control:
    a Signal to Interference Ratio (SIR) estimation block configured to estimate an SIR based on an interference signal, which is estimated from a received signal and a signal transmitted from the relay apparatus, and an interference-cancelled signal determined by canceling the estimated interference signal from the received signal;
    a target Received Signal Strength Indicator (RSSI) determination block configured to determine a target RSSI optimized based on the estimated SIR and a maximum-rate Modulation and Coding Scheme (MCS) level for a particular resource region; and
    an AGC block configured to adjust a gain for the received signal based on the determined target RSSI.

2. The AGC apparatus of claim 1, further comprising:
    a maximum-rate MCS level discrimination block configured to discriminate the maximum-rate MCS level for the particular resource region using information transmitted from the base station.

3. The AGC apparatus of claim 2, further comprising:
    an interference signal estimation block configured to estimate the interference signal from the received signal and provide the estimated interference signal to the SIR estimation block; and
    a receiving modem configured to provide the interference-cancelled signal to the SIR estimation block.

4. The AGC apparatus of claim 3, wherein the interference signal estimation block comprises:
    an interference channel estimator configured to estimate a characteristic of an interference channel from the received signal taking into account the signal transmitted from the relay apparatus; and
    an interference signal estimator configured to estimate an interference signal based on the estimated characteristic of the interference channel and the signal transmitted from the relay apparatus, and providing the estimated interference signal to the SIR estimation block.

5. The AGC apparatus of claim 2, wherein the target RSSI optimized for the estimated SIR is preset to minimize clipping-caused performance degradation due to an AGC operation by the AGC block and performance degradation caused by quantization error that occurs by converting the received signal into a digital signal.

6. The AGC apparatus of claim 2, wherein the maximum-rate MCS level discrimination block discriminates the maximum-rate MCS level for each individual AGC unit using resource allocation information received from the base station.

7. The AGC apparatus of claim 1, wherein the target RSSI determination block determines the target RSSI optimized for the estimated SIR using a target RSSI that is preset for each level of the SIR.

8. The AGC apparatus of claim 1, further comprising:
    an interference signal estimation block configured to estimate the interference signal from the received signal and provide the estimated interference signal to the SIR estimation block; and
    a receiving modem configured to provide the interference-cancelled signal to the SIR estimation block.

9. The AGC apparatus of claim 8, wherein the interference signal estimation block comprises:
an interference channel estimator configured to estimate a characteristic of an interference channel from the received signal taking into account the signal transmitted from the relay apparatus; and
an interference signal estimator configured to estimate an interference signal based on the estimated characteristic of the interference channel and the signal transmitted from the relay apparatus, and provide the estimated interference signal to the SIR estimation block.

10. The AGC apparatus of claim 1, wherein the target RSSI optimized for the estimated SIR is preset to minimize clipping-caused performance degradation due to an AGC operation by the AGC block and performance degradation caused by quantization error that occurs by converting the received signal into a digital signal.

11. An Automatic Gain Control (AGC) method performed in a relay apparatus supporting a full-duplex scheme, the relay apparatus configured for communication between a base station and a terminal, the method comprising:
estimating a Signal to Interference Ratio (SIR) based on an interference signal, which is estimated from a received signal and a signal transmitted from the relay apparatus, and an interference-cancelled signal determined by canceling the estimated interference signal from the received signal;
determining a target Received Signal Strength Indicator (RSSI) optimized based on the estimated SIR and a maximum-rate Modulation and Coding Scheme (MCS) level for a particular resource region; and
adjusting a gain for the received signal based on the determined target RSSI.

12. The AGC method of claim 11, further comprising:
discriminating the maximum-rate MCS level for the particular resource region using information transmitted from the relay apparatus to the base station.

13. The AGC method of claim 12, further comprising:
estimating the interference signal from the received signal; and
acquiring the interference-cancelled signal by canceling the estimated interference signal from the received signal.

14. The AGC method of claim 13, wherein the interference signal estimation comprises:
estimating a characteristic of an interference channel from the received signal taking into account the signal transmitted from the relay apparatus; and
estimating an interference signal based on the estimated characteristic of the interference channel and the signal transmitted from the relay apparatus.

15. The AGC method of claim 12, wherein the target RSSI optimized for the estimated SIR is preset to minimize clipping-caused performance degradation due to an AGC operation and performance degradation caused by quantization error that occurs by converting the received signal into a digital signal.

16. The AGC method of claim 12, wherein the maximum-rate MCS level is discriminated for each individual AGC unit using resource allocation information received from the base station.

17. The AGC method of claim 11, further comprising:
estimating the interference signal from the received signal; and
acquiring the interference-cancelled signal by canceling the estimated interference signal from the received signal.

18. The AGC method of claim 17, wherein the interference signal estimation comprises:
estimating a characteristic of an interference channel from the received signal taking into account the signal transmitted from the relay apparatus; and
estimating an interference signal based on the estimated characteristic of the interference channel and the signal transmitted from the relay apparatus.

19. The AGC method of claim 11, wherein the target RSSI optimized for the estimated SIR is preset to minimize clipping-caused performance degradation due to an AGC operation and performance degradation caused by quantization error that occurs by converting the received signal into a digital signal.

20. An Automatic Gain Control (AGC) apparatus in a relay apparatus supporting a full-duplex scheme, the relay apparatus configured for communication between a base station and a terminal, the AGC apparatus comprising:
a Signal to Interference Ratio (SIR) estimation block configured to estimate an SIR based on an interference signal, which is estimated from a received signal and a signal transmitted from the relay apparatus, and an interference-cancelled signal determined by canceling the estimated interference signal from the received signal;
an interference signal estimation block configured to estimate the interference signal from the received signal and provide the estimated interference signal to the SIR estimation block; and
a receiving modem configured to provide the interference-cancelled signal to the SIR estimation block;
a target Received Signal Strength Indicator (RSSI) determination block configured to determine a target RSSI optimized based on the estimated SIR and a maximum-rate Modulation and Coding Scheme (MCS) level for a particular resource region; and
an AGC block configured to adjust a gain for the received signal based on the determined target RSSI.

* * * * *